(12) United States Patent
Fang et al.

(10) Patent No.: US 9,748,196 B2
(45) Date of Patent: Aug. 29, 2017

(54) SEMICONDUCTOR PACKAGE STRUCTURE INCLUDING DIE AND SUBSTRATE ELECTRICALLY CONNECTED THROUGH CONDUCTIVE SEGMENTS

(71) Applicant: ADVANCED SEMICONDUCTOR ENGINEERING, INC., Kaosiung (TW)

(72) Inventors: Jen-Kuang Fang, Kaohsiung (TW); Kuo-Hua Chen, Kaohsiung (TW)

(73) Assignee: ADVANCED SEMICONDUCTOR ENGINEERING, INC., Kaosiung (TW)

( * ) Notice: Subject to any disclaimer, the term of this patent is extended or adjusted under 35 U.S.C. 154(b) by 0 days.

(21) Appl. No.: 14/486,755

(22) Filed: Sep. 15, 2014

(65) Prior Publication Data
US 2016/0079157 A1    Mar. 17, 2016

(51) Int. Cl.
*H01L 23/48* (2006.01)
*H01L 23/00* (2006.01)
*H01L 23/522* (2006.01)

(52) U.S. Cl.
CPC .......... *H01L 24/33* (2013.01); *H01L 23/5226* (2013.01); *H01L 24/09* (2013.01); *H01L 24/17* (2013.01); *H01L 2224/0401* (2013.01); *H01L 2224/04026* (2013.01); *H01L 2224/0557* (2013.01); *H01L 2224/05571* (2013.01); *H01L 2224/05572* (2013.01); *H01L 2224/06164* (2013.01); *H01L 2224/13644* (2013.01); *H01L 2224/13647* (2013.01); *H01L 2224/13655* (2013.01); *H01L 2224/13664* (2013.01); *H01L 2924/381* (2013.01)

(58) Field of Classification Search
CPC ........... H01L 2224/94; H01L 21/76802; H01L 2224/97; H01L 2224/0401; H01L 2224/05552; H01L 23/528; H01L 2224/73204; H01L 24/05; H01L 25/0657; H01L 2224/16227; H01L 24/17; H01L 2224/13023; H01L 2224/03
USPC ........ 257/737, 773, 784; 438/107, 613, 106, 438/15
See application file for complete search history.

(56) References Cited

U.S. PATENT DOCUMENTS

| | | | |
|---|---|---|---|
| 5,461,261 A * | 10/1995 | Nishiguchi | ............. H01L 24/11 257/737 |
| 7,872,357 B2 | 1/2011 | Yu et al. | |
| 2010/0164098 A1* | 7/2010 | Kuechenmeister | ..... H01L 24/11 257/737 |

(Continued)

*Primary Examiner* — Cory Eskridge
(74) *Attorney, Agent, or Firm* — Foley & Lardner LLP; Cliff Z. Liu

(57) ABSTRACT

The present disclosure relates to a semiconductor package structure, including a die and a package substrate. The die includes a semiconductor substrate, multiple interconnect metal layers, and at least one inter-level dielectric disposed between ones of the interconnect metal layers. Each inter-level dielectric is formed of a low k material. An outermost interconnect metal layer has multiple first conductive segments exposed from a surface of the inter-level dielectric. The package substrate includes a substrate body and multiple second conductive segments exposed from a surface of the substrate body. The second conductive segments are electrically connected to the first conductive segments.

20 Claims, 10 Drawing Sheets

(56) References Cited

U.S. PATENT DOCUMENTS

| | | | |
|---|---|---|---|
| 2010/0193944 A1* | 8/2010 | Castro | H01L 24/16 257/737 |
| 2011/0031581 A1 | 2/2011 | West | |
| 2014/0159203 A1* | 6/2014 | Liu | H01L 24/81 257/536 |
| 2014/0167254 A1* | 6/2014 | Yu | H01L 24/11 257/737 |
| 2014/0342546 A1* | 11/2014 | Hwang | H01L 24/11 438/614 |

* cited by examiner

SEMICONDUCTOR PACKAGE STRUCTURE INCLUDING DIE AND SUBSTRATE ELECTRICALLY CONNECTED THROUGH CONDUCTIVE SEGMENTS

BACKGROUND

1. Technical Field

The present disclosure relates to a semiconductor package structure. In particular, the present disclosure relates to a semiconductor package structure of flip chip bonding.

2. Description of the Related Art

A plurality of solder balls is used to electrically connect a die and a package substrate in a conventional semiconductor package structure of flip chip bonding. In order to match the position of a conductive trace in the package substrate, the die usually has a redistribution layer, and a circuit of the redistribution layer usually has a pad for a solder ball to be attached on. Because the size of the pad is greater than a line width of the circuit of the redistribution layer, the result may be that a pitch in the circuit of the redistribution layer cannot be effectively reduced. In addition, the number of pads is also limited, precluding an increase in connecting positions for an external connection.

SUMMARY

An aspect of the present disclosure relates to a semiconductor package structure, including a die and a package substrate. The die includes a semiconductor substrate, multiple interconnect metal layers, and at least one inter-level dielectric disposed between ones of the interconnect metal layers. Each inter-level dielectric is formed of a low k material. An outermost interconnect metal layer has multiple first conductive segments exposed from a surface of the inter-level dielectric. The package substrate includes a substrate body and multiple second conductive segments exposed from a surface of the substrate body. The second conductive segments are electrically connected to the first conductive segments.

BRIEF DESCRIPTION OF THE DRAWINGS

Common reference numerals are used throughout the drawings and the detailed description to indicate the same or similar elements. Embodiments of the present disclosure will be more apparent from the following detailed description taken in conjunction with the accompanying drawings.

DETAILED DESCRIPTION

Figure 1:
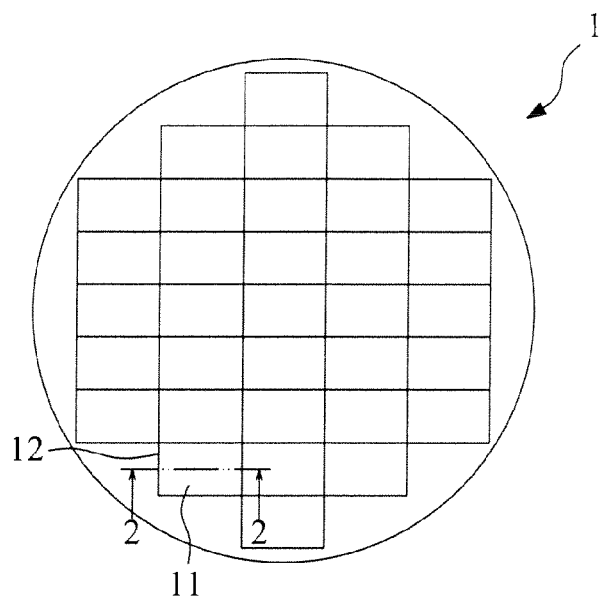
FIG. 1 is a schematic top view of a semiconductor wafer according to an embodiment of the present disclosure.

FIG. 1 is a schematic top view of a semiconductor wafer according to an embodiment of the present disclosure. The semiconductor wafer 1 includes a plurality of die regions 11. In this embodiment, the die regions 11 are defined by a plurality of cutting lines 12.

Figure 2A:
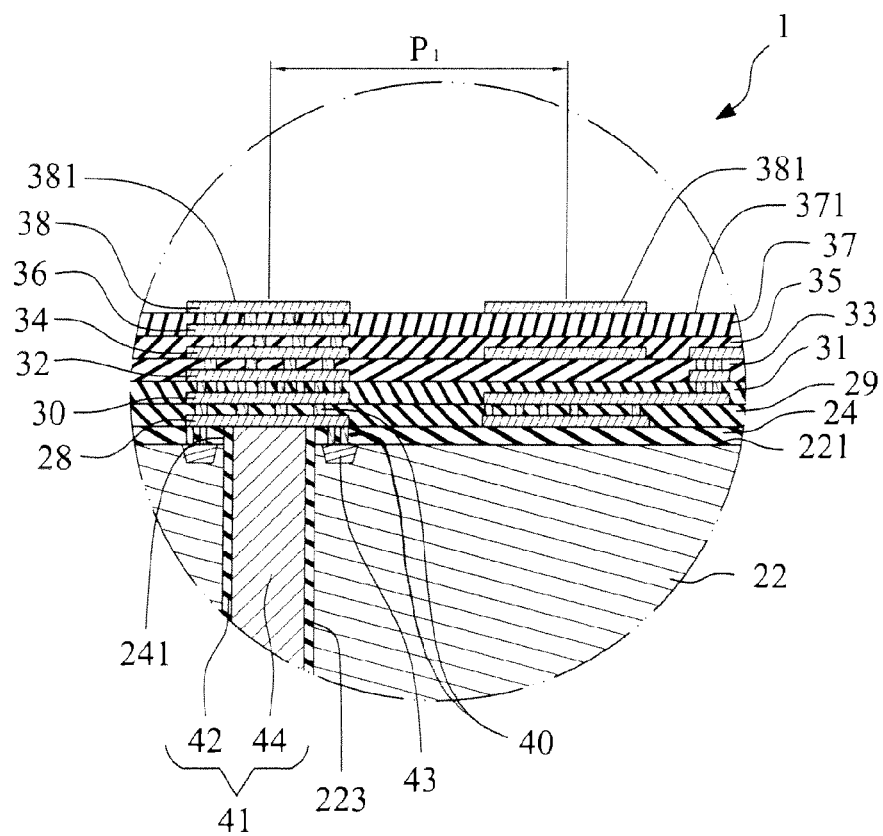
FIG. 2A is a schematic cross-sectional view along line 2-2 in FIG. 1.

FIG. 2A is an enlarged portion of a schematic cross-sectional view along line 2-2 in FIG. 1. The semiconductor wafer 1 includes a semiconductor substrate 22, an insulating layer 24, a plurality of trench isolation regions 43, a plurality of interconnect metal layers 28, 30, 32, 34, 36, 38, a plurality of interconnect vias 40, at least one inter-level dielectric (for example, a plurality of inter-level dielectrics 29, 31, 33, 35, 37), and at least one conductive via 41.

The material of the semiconductor substrate 22 is silicon, germanium or other semiconductor material (for example, an element in Group III, Group IV and/or Group V in the periodic table), and the semiconductor substrate 22 has a surface 221. The insulating layer 24 is insulating material and is located on the surface 221 of the semiconductor substrate 22. The trench isolation regions 43 (for example, a source or a drain) are opened on the surface 221 of the semiconductor substrate 22.

The interconnect metal layers 28, 30, 32, 34, 36, 38 are disposed adjacent to the surface 221 of the semiconductor substrate 22. The interconnect metal layer 28 is defined as a first metal layer (M1), the interconnect metal layer 30 is defined as a second metal layer (M2), the interconnect metal layer 32 is defined as a third metal layer (M3), the interconnect metal layer 34 is defined as a fourth metal layer (M4), the interconnect metal layer 36 is defined as a fifth metal layer (M5), and the interconnect metal layer 38 is defined as a sixth metal layer (M6). The interconnect metal layers 30, 32, 34, 36, 38 (M2 to M6) are sequentially located above the interconnect metal layer 28 (M1). It can be understood that the number of the interconnect metal layers is not limited to 6, and may also be 7, 8 or another number of layers.

In the embodiment of FIG. 2A, the interconnect metal layer 28 (M1) is located on the insulating layer 24, and is connected to the trench isolation regions 43 through one or more interconnect vias 40. The material of the interconnect metal layers 28, 30, 32, 34, 36, 38 and the interconnect vias 40 is copper or copper alloy. In some embodiments, the interconnect metal layers 28, 30, 32, 34, 36, 38 and/or the interconnect vias 40 are formed of, or include, another conductive material other than copper or copper alloy.

The inter-level dielectrics 29, 31, 33, 35, 37 are disposed adjacent to the surface 221 of the semiconductor substrate 22. The inter-level dielectrics 29, 31, 33, 35, 37 are formed of, or include, low k material. In this embodiment, the low-k material is a dielectric material with a small dielectric constant relative to silicon dioxide, the dielectric constant of which is lower than 3.4. For example, the low-k material may be Fluorine-doped silicon dioxide, carbon-doped silicon dioxide, porous silicon dioxide, porous carbon-doped silicon dioxide, spin-on organic polymeric dielectric or spin-on silicon based polymeric dielectric. The inter-level dielectrics 29, 31, 33, 35, 37 may be formed of, or include, an ultra-low k material, the dielectric constant of which is lower than 2.5. The inter-level dielectrics 29, 31, 33, 35, 37 are disposed between the interconnect metal layers 28, 30, 32, 34, 36, 38. For example, the inter-level dielectric 29 covers the interconnect metal layer 28 and the insulating layer 24, and the interconnect metal layer 30 is located on the inter-level dielectric 29; therefore, the inter-level dielectric 29 is disposed between the interconnect metal layer 28 and the interconnect metal layer 30. In addition, the interconnect vias 40 penetrate through the inter-level dielectrics 29, 31, 33, 35, 37 to connect ones of the upper and lower interconnect metal layers 28, 30, 32, 34, 36, 38. It can be understood that, in some embodiments, the inter-level dielectrics 29, 31, 33, 35, 37 all have the same material and therefore have unclear interfaces therebetween, and may be regarded as one layer.

In the embodiment of FIG. 2A, the outermost interconnect metal layer 38 has a plurality of first conductive segments 381 exposed from a surface 371 of the outermost inter-level dielectric 37 for external connections. In this embodiment, the first conductive segments 381 protrude from the surface 371 of the outermost inter-level dielectric 37 for external connections. That is, the first conductive segments 381 are located on the outermost inter-level dielectric 37, and a surface of the first conductive segments 381 is higher than the surface 371 of the outermost inter-level dielectric 37 (with respect to the cross-sectional view of FIG. 2A).

The first conductive segments 381 are not traditional pads. A pitch $P_1$ between two adjacent first conductive segments 381 is less than 20 μm. Therefore, one die region 11 may have several first conductive segments 381, that is, have more connecting positions for external connections, thereby facilitating a layout design of a circuit. In addition, the first conductive segments 381 are formed into a first pattern; the first pattern is formed according to optimization of circuit design performance.

The conductive via 41 penetrates through the semiconductor substrate 22 and the insulating layer 24 to contact the interconnect metal layer 28 (M1). In this embodiment, the conductive via 41 includes an annular insulating layer 42 and a central metal 44. The annular insulating layer 42 is located on a sidewall of a through hole 223 of the semiconductor substrate 22 and a sidewall of a through hole 241 of the insulating layer 24, so as to form a central hole. The central metal 44 fills the central hole and contacts the interconnect metal layer 28 (M1). The material of the annular insulating layer 42 is polymer, for example, polyimide (PI) or polypropylene (PP), and the material of central metal 44 is, for example, copper or copper alloy.

Figure 2B:
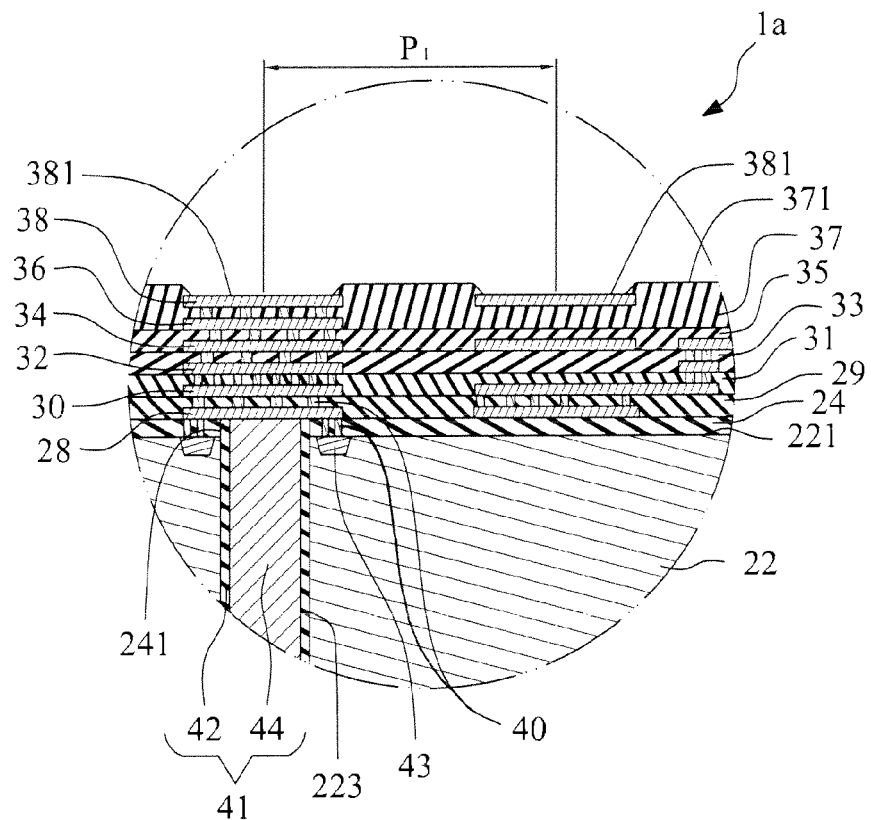
FIG. 2B is a schematic partial cross-sectional view of a semiconductor wafer according to another embodiment of the present disclosure.

FIG. 2B is a schematic partial cross-sectional view of a semiconductor wafer according to another embodiment of the present disclosure. The semiconductor wafer 1a in this embodiment is similar to the semiconductor wafer 1 shown in FIG. 1 and FIG. 2A, and the differences therebetween are discussed below. In the semiconductor wafer 1a of the embodiment of FIG. 2B, the first conductive segments 381 are recessed from the surface 371 of the outermost inter-level dielectric 37 and are exposed from the surface 371. That is, a top surface of the first conductive segments 381 is lower than the surface 371 of the outermost inter-level dielectric 37 (with respect to the cross-sectional view of FIG. 2A).

Figure 3A:
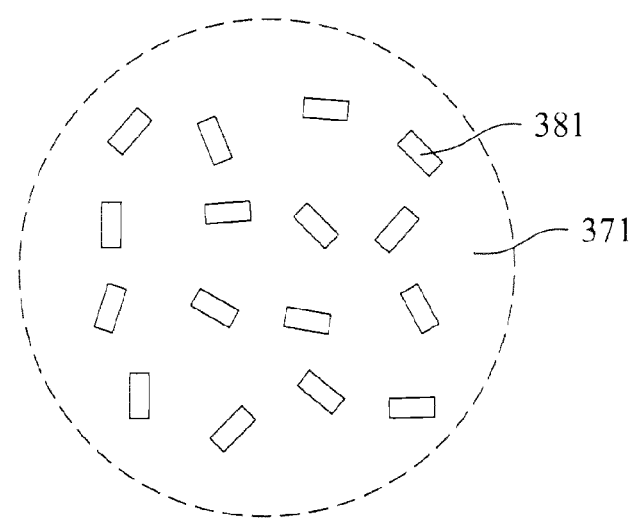
FIG. 3A is a schematic partial top view of a semiconductor wafer according to an embodiment of the present disclosure.

FIG. 3A is a schematic partial top view of a semiconductor wafer according to an embodiment of the present disclosure. As shown in FIG. 3A, the first conductive segments 381 are distributed irregularly. The irregular pattern illustrated is provided by way of example and not limitation, and other irregular patterns are also possible.

Figure 3B:
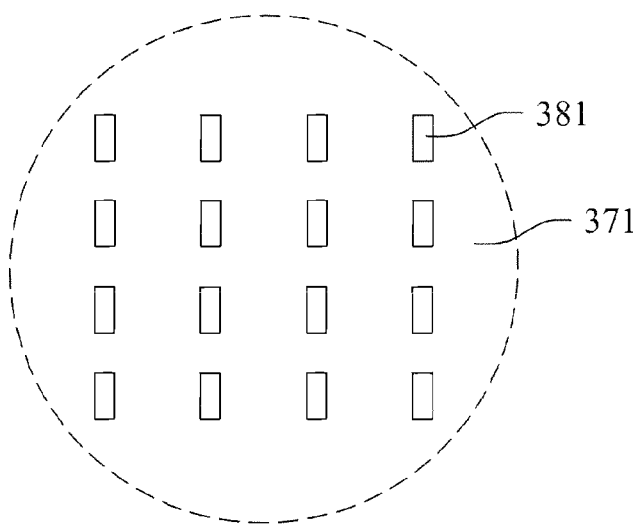
FIG. 3B is a schematic partial top view of a semiconductor wafer according to another embodiment of the present disclosure.

FIG. 3B is a schematic partial top view of a semiconductor wafer according to another embodiment of the present disclosure. As shown in FIG. 3B, the first conductive segments 381 are distributed regularly. The regular pattern illustrated is provided by way of example and not limitation, and other regular patterns are also possible.

Figure 4A:
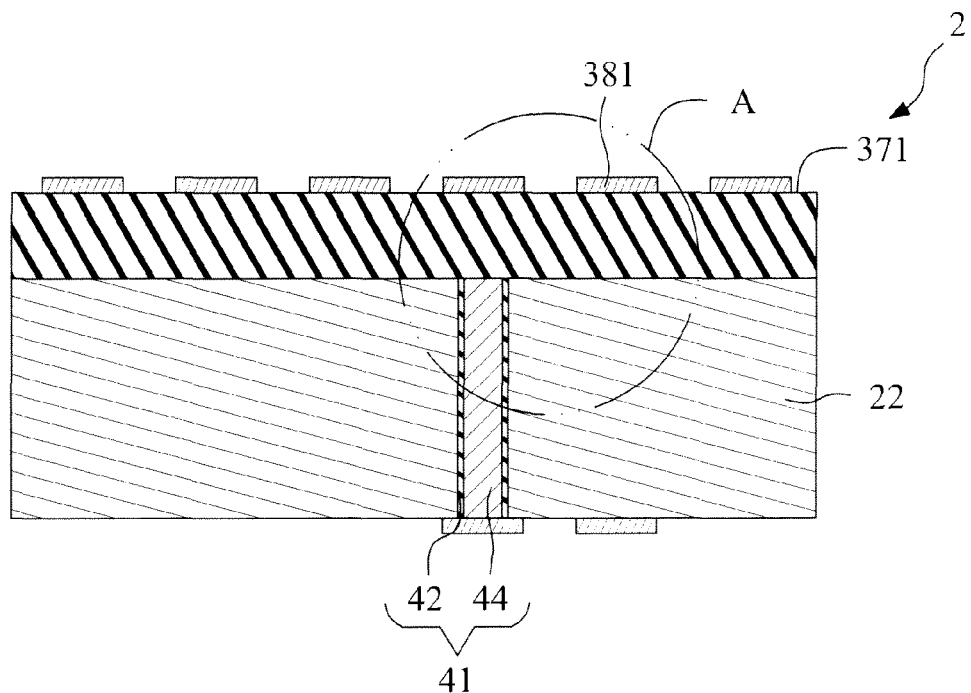
FIG. 4A is a schematic cross-sectional view of a die according to an embodiment of the present disclosure.

FIG. 4A is a schematic cross-sectional view of a die 2 according to an embodiment of the present disclosure, where a partial region A of the die 2 was illustrated in FIG. 2A. In this embodiment, the first conductive segments 381 protrude from the surface 371 of the outermost inter-level dielectric 37 for external connections (refer also to FIG. 2A).

Figure 4B:
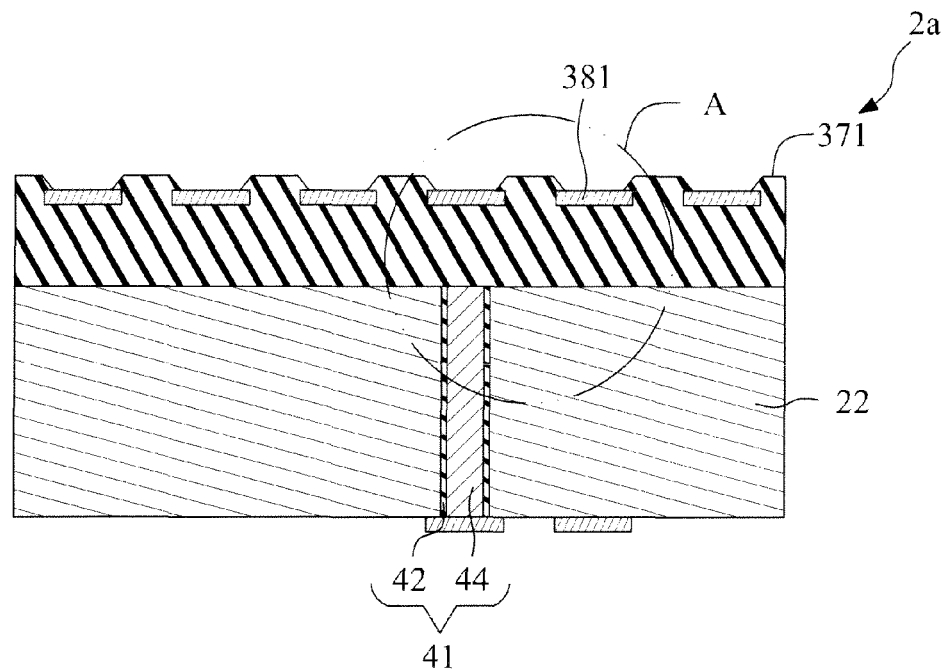
FIG. 4B is a schematic cross-sectional view of a die according to another embodiment of the present disclosure.

FIG. 4B is a schematic cross-sectional view of a die 2a according to another embodiment of the present disclosure, where a partial region A of the die 2a was illustrated in FIG. 2B. In the die 2a, the first conductive segments 381 are recessed from the surface 371 of the outermost inter-level dielectric 37 and are exposed from the surface 371 (refer also to FIG. 2B). That is, a top surface of the first conductive segments 381 is lower than the surface 371 of the outermost inter-level dielectric 37.

Figure 5A:
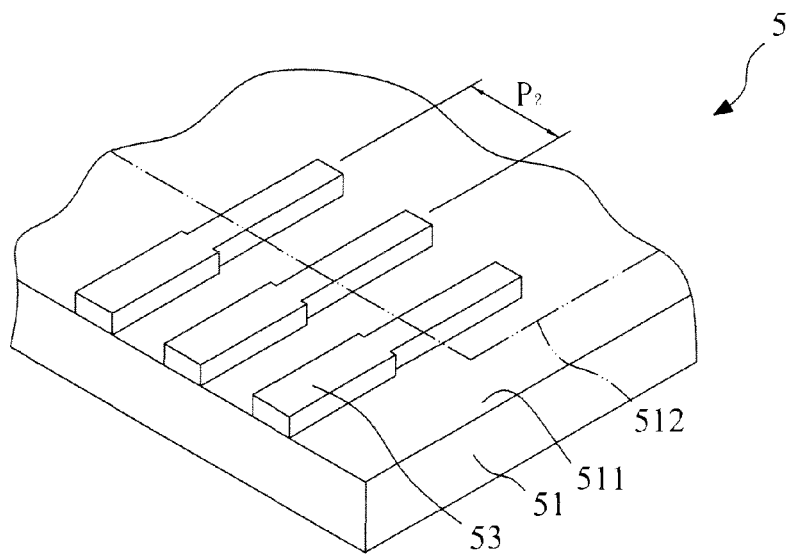
FIG. 5A is a schematic perspective view of a package substrate according to an embodiment of the present disclosure.

FIG. 5A is a schematic perspective view of a package substrate 5 according to an embodiment of the present disclosure. The package substrate 5 includes a substrate body 51 and a plurality of second conductive segments 53. The substrate body 51 is an organic substrate with a plurality of laminate materials, wherein the laminate materials are made of glass fibers in an epoxy. The substrate body 51 has an upper surface 511. The material of the second conductive segments 53 is copper or copper alloy. In other embodiments, second conductive segments 53 are formed of, or include, another conductive material. The second conductive segments 53 are disposed adjacent to the upper surface 511 and are exposed from the upper surface 511. The second conductive segments 53 are designed for electrical connection to the first conductive segments 381 of the die 1, 2 or the die 1*a*, 2*a*, and the pitch $P_1$ between two adjacent first conductive segments 381 (see FIGS. 2A, 2B for pitch $P_1$) is the same as a pitch $P_2$ (see FIG. 5A for pitch $P_2$) between two adjacent second conductive segments 53. Therefore, the pitch between two adjacent second conductive segments 53 is less than 20 µm. The second conductive segments 53 are formed into a second pattern, and the second pattern is formed according to optimization of circuit design performance. In this embodiment, the upper surface 511 has a bonding region 512 for the die 1, 2 or the die 1*a*, 2*a* to be bonded to the substrate body 51. The portion of each second conductive segment 53 located inside the bonding region 512 has a consistent or a uniform width along the length of the portion; that is, the portion does not have a pad with large size.

In the embodiment of FIG. 5A, the second conductive segments 53 protrude from the upper surface 511. That is, the second conductive segments 53 are located on the upper surface 511, and an upper surface of the second conductive segments 53 is higher than the upper surface 511.

Figure 5B:
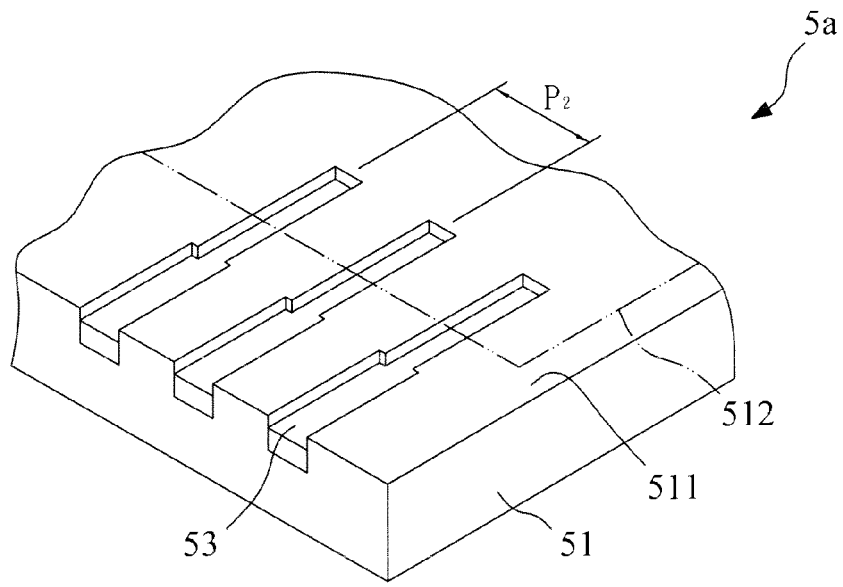
FIG. 5B is a schematic perspective view of a package substrate according to another embodiment of the present disclosure.

FIG. 5B is a schematic perspective view of a package substrate according to another embodiment of the present disclosure. The package substrate 5*a* in this embodiment is similar to the package substrate 5 shown in FIG. 5A, except that the second conductive segments 53 are recessed from the upper surface 511 and are exposed from the upper surface 511. That is, a top surface of the second conductive segments 53 is lower than that of the upper surface 511.

Figure 6:
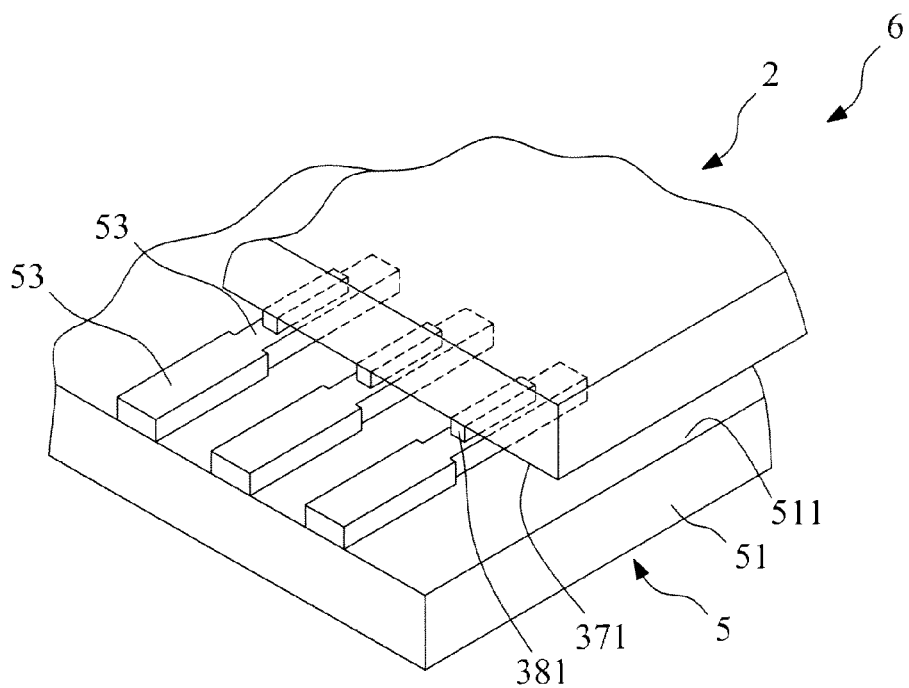
FIG. 6 is a schematic perspective view of a semiconductor package structure according to an embodiment of the present disclosure.

FIG. 6 is a schematic perspective view of a semiconductor package structure according to an embodiment of the present disclosure. The semiconductor package structure 6 includes a die 2 and a package substrate 5. The die 2 is the die 2 shown in FIG. 4A, and includes the first conductive segments 381 exposed from the surface 371 of the outermost inter-level dielectric 37 for external connections. The package substrate 5 is the package substrate 5 shown in FIG. 5A, and includes the second conductive segments 53. The second conductive segments 53 are disposed adjacent to an upper surface 511 of the package substrate 5 and are exposed from the upper surface 511. The second conductive segments 53 are electrically connected to the first conductive segments 381 in a bonding region 512 (refer to FIG. 5A), and a portion of each second conductive segment 53 located inside the bonding region 512 has a consistent width along its length; and/or each first conductive segment 381 located inside the bonding region 512 has a consistent or a uniform width along its length. In addition, the pitch $P_1$ (see FIG. 2A, an enlarged portion of FIG. 4A) between two adjacent first conductive segments 381 is the same as the pitch $P_2$ (see FIG. 5A) between two adjacent second conductive segments 53.

In the embodiment of FIG. 6, signals of the die 2 are transmitted through the first conductive segments 381, and the signals of the package substrate 5 are transmitted through the second conductive segments 53. Thus, signals may propagate between die 2 and package substrate 5 by way of an electrical connection between first conductive segments 381 and second conductive segments 53.

Figure 7A:
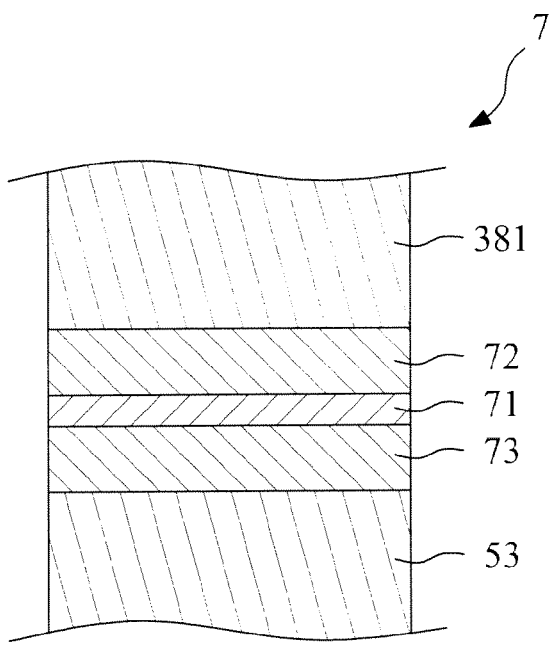
FIG. 7A is an enlarged schematic partial cross-sectional view of a position where the first conductive segment and the second conductive segment are bonded in a semiconductor package structure of the present disclosure.

FIG. 7A is an enlarged schematic partial cross-sectional view of a position where a first conductive segment 381 and a second conductive segment 53 are bonded in an embodiment of a semiconductor package structure of the present disclosure. In this embodiment, a bonding structure 7 includes the first conductive segment 381, the second conductive segment 53, a middle region 71, a first interface 72, and a second interface 73. The first conductive segment 381 includes a first metal, and the second conductive segment 53 also includes the first metal, and the first metal is selected from a group consisting of silver, gold, aluminum, and copper.

The middle region 71 is located between the first conductive segment 381 and the second conductive segment 53, and also includes the first metal. The first interface 72 is located between the first conductive segment 381 and the middle region 71, and also includes the first metal along with an oxide of a second metal. In some embodiments, the first metal is different from the second metal. In such embodiments, a proportion of content of the first metal in the first interface 72 is less than that of the first metal in the middle region 71. The second interface 73 is located between the second conductive segment 53 and the middle region 71, and also includes the first metal and the oxide of the second metal. In embodiments in which the first metal is different from the second metal, a proportion of content of the first metal in the second interface 73 is less than that of the first metal in the middle region 71.

The second metal is selected from a group consisting of silver, gold, platinum, palladium, osmium, iridium, ruthenium, titanium, magnesium, aluminum, copper, cobalt, nickel, and zinc. In one embodiment, the second metal is titanium, and the oxide of the second metal is a titanium dioxide. It should be noted that, in this embodiment, none of the first conductive segment 381, the second conductive segment 53, and the middle region 71 includes the oxide of the second metal (that is, a titanium dioxide).

In the embodiment of FIG. 7A, the first interface 72 contacts the first conductive segment 381 and the middle region 71 in a continuous interface, and the second interface 73 contacts the second conductive segment 53 and the middle region 71 in a continuous interface. However, in other embodiments, the first interface 72 is a discontinuous interface, making the first conductive segment 381 contact the middle region 71 in places; and the second interface 73 is a discontinuous interface, making the second conductive segment 53 contact the middle region 71 in places.

Figure 7B:
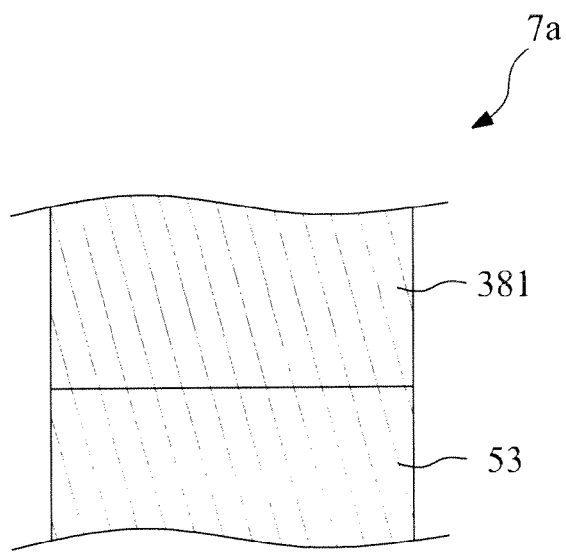
FIG. 7B is a schematic view of another example of the position where the first conductive segment and the second conductive segment are bonded in the semiconductor package structure of the present disclosure.

FIG. 7B is a schematic view of another example of the position where the first conductive segment 381 and the second conductive segment 53 are bonded in an embodiment of a semiconductor package structure of the present disclosure. In this embodiment, the first conductive segments 381 directly contact the second conductive segments 53 to form a bonding structure 7*a*.

Figure 7C:
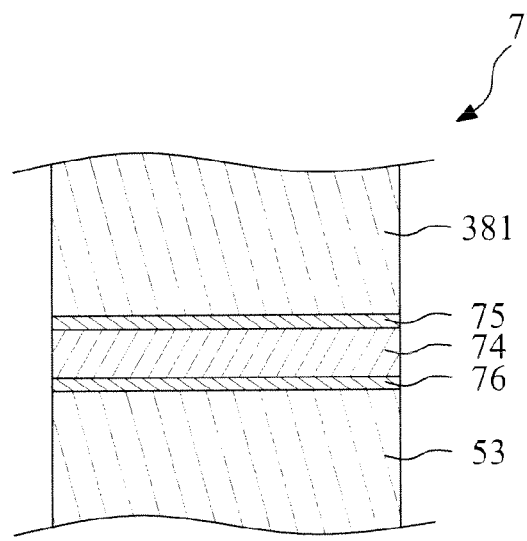
FIG. 7C is a schematic view of another example of the position where the first conductive segment and the second conductive segment are bonded in the semiconductor package structure of the present disclosure.

FIG. 7C is a schematic view of another example of the position where the first conductive segment and the second conductive segment are bonded in an embodiment of a semiconductor package structure of the present disclosure. In this embodiment, a bonding structure 7*b* includes a first conductive segment 381, a second conductive segment 53, an intermediate metal 74, a first intermetallic compound (IMC) 75, and a second IMC 76. The intermediate metal 74, the first IMC, and the second IMC are located between the first conductive segment 381 and the second conductive segment 53. The first IMC 75 is provided between the intermediate metal 74 and the first conductive segment 381, and the second IMC 76 is provided between the intermediate metal 74 and the second conductive segment 53.

In the embodiment of FIG. 7C, the material of both the first conductive segment 381 and the second conductive segment 53 may be the same, and may be different from one or more of the first IMC 75, the second IMC 76, and the intermediate metal 74. In one example, the first conductive segment 381 and the second conductive segment 53 are formed of, or include, copper, the intermediate metal 74 is selected from a group consisting of silver, gold, palladium, titanium, nickel, tin, and indium, and the first IMC 75 and the second IMC 76 are $(Cu,Ni)_6Sn_5$ or $(Cu,Ni)_3Sn_4$.

Figure 8:
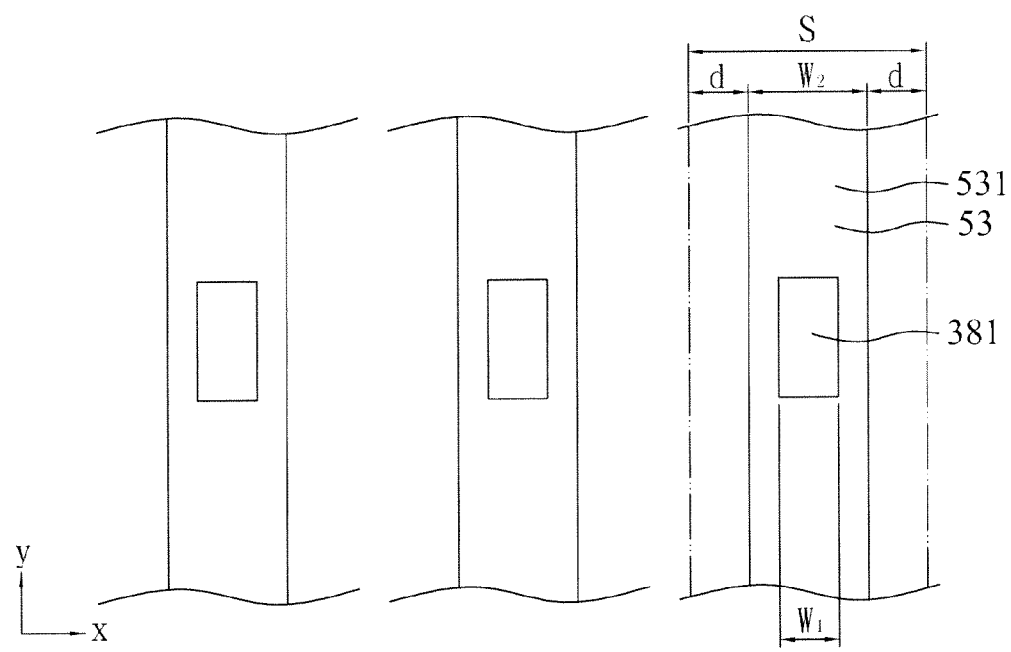
FIG. 8 is a schematic top view of a position where the first conductive segment and the second conductive segment are bonded in a semiconductor package structure of the present disclosure.

FIG. 8 is a schematic top view of a position where the first conductive segments 381 and the second conductive segments 53 are bonded in an embodiment of a semiconductor package structure of the present disclosure. A second conductive segment 53 has a surface 531. A projection area of a first conductive segment 381 being projected on the surface 531 of the second conductive segment 53 is located inside the range of the surface 531 of the second conductive segment 53.

Alternatively, the second conductive segment 53 has a surface 531 and an imaginary surface S. The imaginary surface S is formed by the surface 531 expanding by a predetermined distance d from two sides of the surface 531 respectively. For example, the predetermined distance d is half of a width $W_2$ of the second conductive segment 53. A projection area of the first conductive segment 381 being projected on the surface 531 of the second conductive segment 53 is located inside the range of the imaginary surface S of the second conductive segment 53.

The second conductive segments 53 in FIG. 8 have a longitudinal direction y and a traverse direction x. The longitudinal direction y is an extending direction of the second conductive segments 53. The traverse direction x is perpendicular to the longitudinal direction y. A second conductive segment 53 has a second traverse width $W_2$ along the traverse direction x. A first conductive segment 381 has a first traverse width $W_1$ along the traverse direction x. The first traverse width $W_1$ is less than or equal to the second traverse width $W_2$. For example, the first traverse width $W_1$ may be in the range of approximately 1 μm to approximately 3 μm (such as approximately 1 μm, 1.1 μm, 1.2 μm, 2.5 μm, 2.8 μm, 3 μm, and so forth) and the second traverse width $W_2$ may be approximately one to approximately three times the width $W_1$ (such as approximately 1.3 times, 2.2 times, 2.9 times, and so forth). In the embodiment of FIG. 8, the extending direction of the first conductive segments 381 is parallel to that of the second conductive segments 53, both being along the longitudinal direction y.

Figure 9:
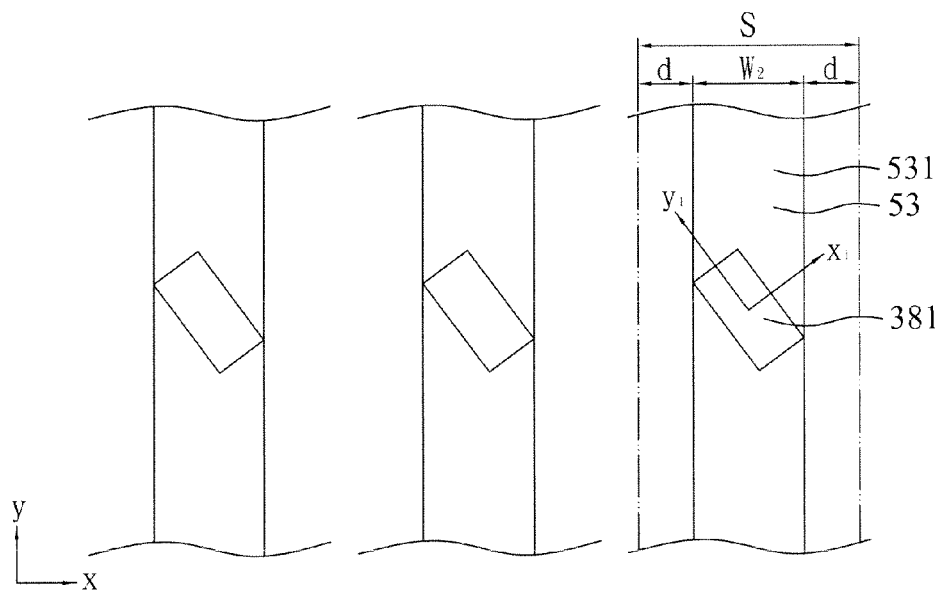
FIG. 9 is a schematic top view of another example of a position where the first conductive segment and the second conductive segment are bonded in the semiconductor package structure of the present disclosure.

FIG. 9 is a schematic top view of another example of a position where the first conductive segments 381 and the second conductive segments 53 are bonded in an embodiment of a semiconductor package structure of the present disclosure. In this example, an angle is formed between the extending direction $y_1$ of the first conductive segments 381 and the extending direction y of the second conductive segments 53. It should be noted that, in this example, a projection area of a first conductive segment 381 being projected on the surface 531 of a second conductive segment 53 is located inside the range of the surface 531 of the second conductive segment 53. Alternatively, the projection area of the first conductive segment 381 being projected on the surface 531 of the second conductive segment 53 is located inside the range of an imaginary surface S of the second conductive segment 53, similarly to the description of imaginary surface S with respect to FIG. 8.

Figure 10:
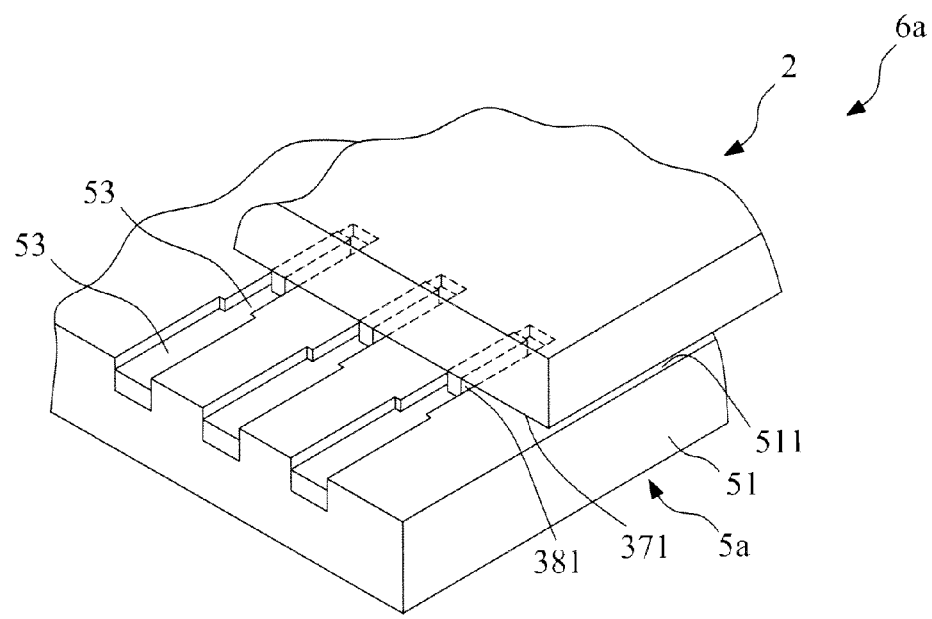
FIG. 10 is a schematic perspective view of a semiconductor package structure according to another embodiment of the present disclosure.

FIG. 10 is a schematic perspective view of a semiconductor package structure according to another embodiment of the present disclosure. The semiconductor package structure 6a includes a die 2 and a package substrate 5a. The die 2 is the die 2 shown in FIG. 4A, and includes the first conductive segments 381 exposed from the surface 371 of the outermost inter-level dielectric for external connections. The package substrate 5a is the package substrate 5a shown in FIG. 5B, and includes the second conductive segments 53 recessed from the upper surface 511 and exposed from the upper surface 511. In this embodiment, the first conductive segments 381 directly contact the second conductive segments 53.

Figure 11:
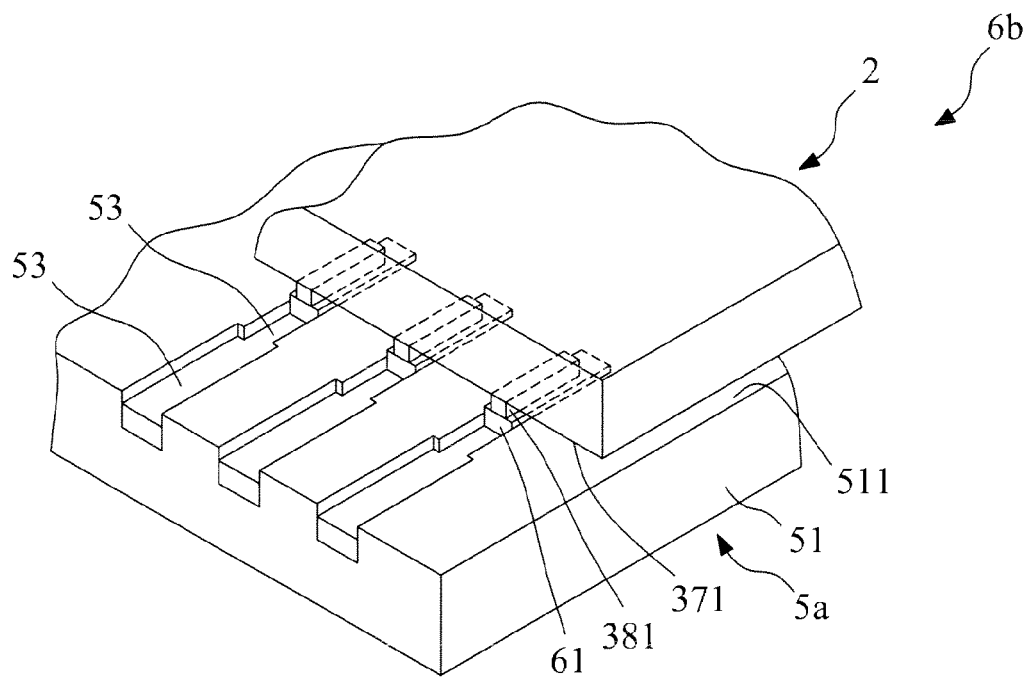
FIG. 11 is a schematic perspective view of a semiconductor package structure according to another embodiment of the present disclosure.

FIG. 11 is a schematic perspective view of a semiconductor package structure according to another embodiment of the present disclosure. The semiconductor package structure 6b includes a die 2, a plurality of electrically connecting elements 61, and a package substrate 5a. The die 2 is the die 2 shown in FIG. 4A, and includes the first conductive segments 381 exposed from the surface 371 of the outermost inter-level dielectric for external connections. The package substrate 5a is the package substrate 5a shown in FIG. 5B, and includes the second conductive segments 53 recessed from the upper surface 511 and exposed from the upper surface 511. The electrically connecting elements 61 are located between the first conductive segments 381 and the second conductive segments 53. In other words, in this embodiment, the first conductive segments 381 do not directly contact the second conductive segments 53. The electrically connecting elements 61 may be formed of, for example, solder, copper posts, electroless nickel immersion gold (ENIG), electroless nickel electroless palladium immersion gold (ENEPIG), gold studs or anisotropic conductive films (ACF).

Figure 12:
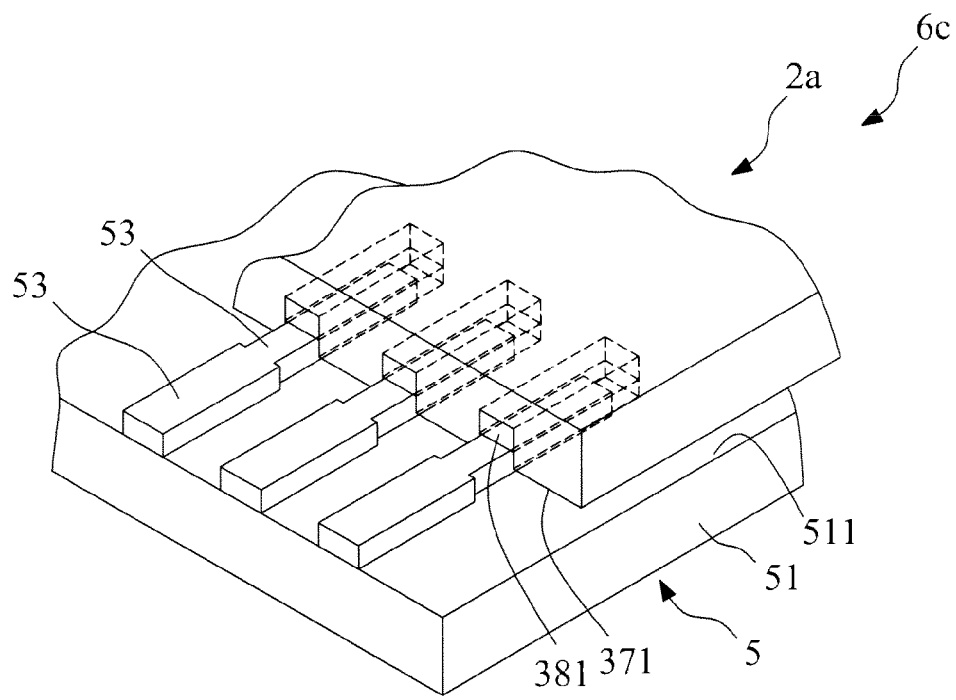
FIG. 12 is a schematic perspective view of a semiconductor package structure according to another embodiment of the present disclosure.

FIG. 12 is a schematic perspective view of a semiconductor package structure according to another embodiment of the present disclosure. The semiconductor package structure 6c includes a die 2a and a package substrate 5. The die 2a is the die 2a shown in FIG. 4B, and includes the first conductive segments 381 recessed from the surface 371 of the outermost inter-level dielectric and exposed from the surface 371 for external connections. The package substrate 5 is the package substrate 5 shown in FIG. 5A, and includes the second conductive segments 53 protruding from the upper surface 511. In this embodiment, the first conductive segments 381 directly contact the second conductive segments 53. It can be understood that, in other embodiments, there are electrically connecting elements, such as electrically connecting elements 61, disposed between the first conductive segments 381 and the second conductive segments 53. In other words, the first conductive segments 381 would not directly contact the second conductive segments 53.

Figure 13:
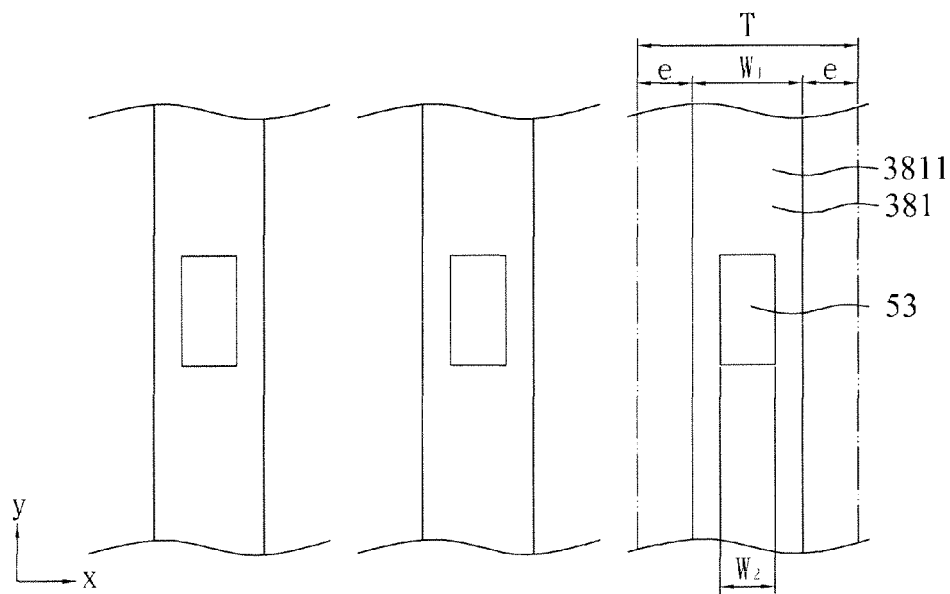
FIG. 13 is a schematic bottom view of the position where the first conductive segment and the second conductive segment are bonded in the semiconductor package structure in FIG. 12.

FIG. 13 is a schematic bottom view of a position where the first conductive segment and the second conductive segment are bonded in an embodiment of a semiconductor package structure according to this disclosure. The first conductive segment 381 has a surface 3811. A projection area of the second conductive segment 53 being projected on the surface 3811 of the first conductive segment 381 is located inside the range of the surface 3811 of the first conductive segment 381.

Alternatively, the first conductive segment 381 has a surface 3811 and an imaginary surface T. The imaginary surface T is formed by the surface 3811 expanding by a predetermined distance e from two sides of the surface 3811 respectively. The predetermined distance e, may be, for example, half of the width $W_1$ of the first conductive segment 381. A projection area of the second conductive segment 53 being projected on the surface 3811 of the first conductive segment 381 is located inside the range of the imaginary surface T of the first conductive segment 381.

The first conductive segment 381 has a longitudinal direction y and a traverse direction x. The longitudinal direction y is an extending direction of the first conductive segment 381. The traverse direction x is perpendicular to the longitudinal direction y. The second conductive segment 53 has a second traverse width $W_2$ along the traverse direction x. The first conductive segment 381 has a first traverse width $W_1$ along the traverse direction x. The second traverse width $W_2$ is less than or equal to the first traverse width $W_1$. For example, the second traverse width $W_2$ may be in the range of approximately 1 µm to approximately 3 µm (such as approximately 1 µm, 1.1 µm, 1.2 µm, 2.5 µm, 2.8 µm, 3 µm, and so forth) and the first traverse width $W_1$ may be approximately one to approximately three times the width $W_2$ (such as approximately 1.3 times, 2.2 times, 2.9 times, and so forth). In this embodiment, the extending direction of the first conductive segments 381 is parallel to the extending direction of the second conductive segment 53, both being along the longitudinal direction y.

Figure 14:
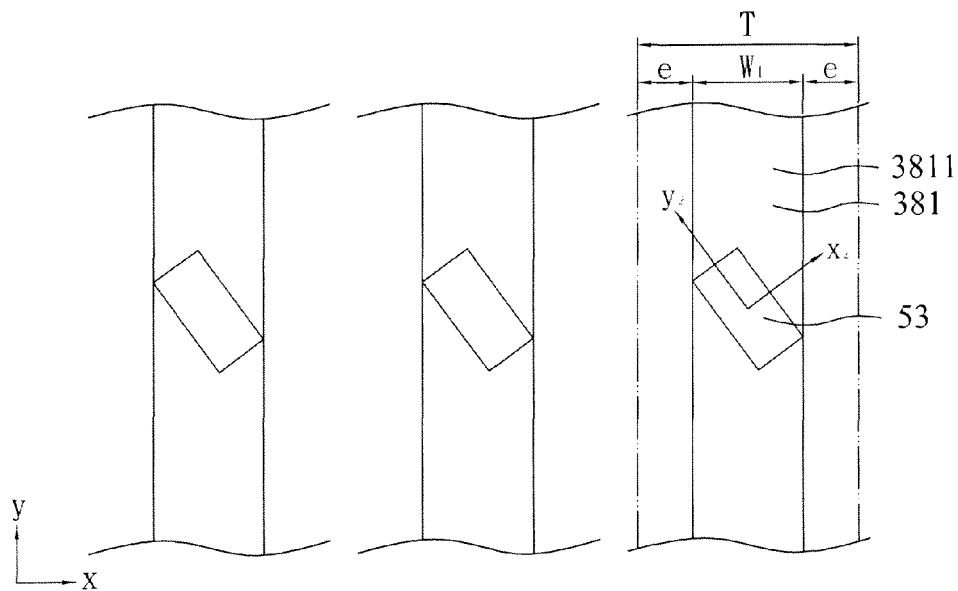
FIG. 14 is a schematic bottom view of another example of the position where the first conductive segment and the second conductive segment are bonded in the semiconductor package structure in FIG. 12.

FIG. 14 is a schematic bottom view of another example of the position where the first conductive segment and the second conductive segment are bonded in an embodiment of a semiconductor package structure according to this disclosure. In this example, an angle is formed between the extending direction $y_2$ of the second conductive segments 53 and the extending direction y of the first conductive segments 381. It should be noted that, in this example, a projection area of the second conductive segment 53 being projected on the surface 3811 of the first conductive segment 381 is located inside the range of the surface 3811 of the first conductive segment 381. Alternatively, a projection area of the second conductive segment 53 being projected on the surface 3811 of the first conductive segment 381 is located inside the range of the imaginary surface T of the first conductive segment 381.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, the terms can refer to less than or equal to ±10%, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations do not limit the present disclosure. It should be understood by those skilled in the art that various changes may be made and equivalents may be substituted without departing from the true spirit and scope of the present disclosure as defined by the appended claims. The illustrations may not be necessarily be drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. A semiconductor package structure, comprising:
   a die, comprising:
      a semiconductor substrate;
      a plurality of interconnect metal layers, disposed adjacent to a surface of the semiconductor substrate; and
      at least one inter-level dielectric disposed between ones of the plurality of interconnect metal layers;
      wherein an outermost interconnect metal layer includes a plurality of first conductive segments exposed from a surface of the inter-level dielectric for external connections; and
   a package substrate, comprising:
      a substrate body; and
      a plurality of second conductive segments disposed adjacent to a surface of the substrate body and exposed from the surface of the substrate body, wherein the second conductive segments are electrically connected to corresponding ones of the first conductive segments;
   wherein one of the first conductive segments comprises a first metal, a corresponding one of the second conductive segments comprises the first metal, and the semiconductor package structure further comprises:
      a middle region, located between the one of the first conductive segments and the corresponding one of the second conductive segments, and comprising the first metal;
      a first interface, located between the one of the first conductive segments and the middle region, and comprising the first metal, wherein a proportion of content of the first metal in the first interface is less than that of the first metal in the middle region; and
      a second interface, located between the corresponding one of the second conductive segments and the middle region, and comprising the first metal, wherein a proportion of content of the first metal in the second interface is less than that of the first metal in the middle region, the second interface further comprising an oxide of a second metal.

2. The semiconductor package structure according to claim 1, wherein the at least one inter-level dielectric is a plurality of inter-level dielectrics comprising an outermost inter-level dielectric, and the first conductive segments protrude from a surface of the outermost inter-level dielectric.

3. The semiconductor package structure according to claim 1, wherein the second conductive segments protrude from the surface of the substrate body.

4. The semiconductor package structure according to claim 1, wherein a pitch between two first conductive segments is less than 20 μm.

5. The semiconductor package structure according to claim 1, the first interface further comprising an oxide of the second metal.

6. The semiconductor package structure according to claim 1, wherein the at least one inter-level dielectric is a plurality of inter-level dielectrics including an outermost inter-level dielectric, and the first conductive segments are recessed from a surface of the outermost inter-level dielectric and are exposed from the surface of the outermost inter-level dielectric.

7. The semiconductor package structure according to claim 1, wherein the second conductive segments are recessed from the surface of the substrate body.

8. The semiconductor package structure according to claim 1, wherein a pitch between two of the first conductive segments is the same as that between two of the second conductive segments.

9. The semiconductor package structure according to claim 1, wherein the first conductive segments are electrically connected to the second conductive segments within a bonding region, and a portion of each second conductive segment located inside the bonding region has a consistent width along its length, or each first conductive segment located inside the bonding region has a consistent width along its length.

10. The semiconductor package structure according to claim 1, wherein one of the second conductive segments has a surface, and a projection area of a corresponding one of the first conductive segments projected on the surface of the second conductive segment is located inside a boundary of the surface of the second conductive segment.

11. The semiconductor package structure according to claim 1, wherein one of the second conductive segments has an actual surface and an imaginary surface, the imaginary surface is formed by expanding by a predetermined distance from two sides of the actual surface respectively, and a projection area of a corresponding one of the first conductive segments is located inside the imaginary surface of the one of the second conductive segments.

12. The semiconductor package structure according to claim 1, wherein the second conductive segments have a longitudinal direction and a traverse direction, the longitudinal direction is an extending direction of the second conductive segments, the traverse direction is perpendicular to the longitudinal direction, the second conductive segments have a second traverse width along the traverse direction, the first conductive segments have a first traverse width along the traverse direction, and the first traverse width is less than or equal to the second traverse width.

13. The semiconductor package structure according to claim 1, wherein an angle is formed between an extending direction of the first conductive segments and an extending direction of the second conductive segments.

14. The semiconductor package structure according to claim 1, wherein one of the first conductive segments has a surface, and a projection area of a corresponding one of the second conductive segments projected on the surface of the one of the first conductive segments is located inside a boundary of the surface of the first conductive segment.

15. The semiconductor package structure according to claim 1, wherein one of the first conductive segments has an actual surface and an imaginary surface, the imaginary surface is formed by expanding by a predetermined distance from two sides of the actual surface, and a projection area of a corresponding one of the second conductive segment projected on the surface of the first conductive segments is located inside a boundary of the imaginary surface of the first conductive segment.

16. The semiconductor package structure according to claim 1, wherein the first conductive segments have a longitudinal direction and a traverse direction, the longitudinal direction is an extending direction of the first conductive segments, the traverse direction is perpendicular to the longitudinal direction, the first conductive segments have a first traverse width along the traverse direction, the second conductive segments have a second traverse width along the traverse direction, and the second traverse width is less than or equal to the first traverse width.

17. A semiconductor package structure, comprising:
  a die, comprising:
    a semiconductor substrate;
    a plurality of interconnect metal layers, disposed adjacent to a surface of the semiconductor substrate; and
    at least one inter-level dielectric disposed between ones of the plurality of interconnect metal layers, each inter-level dielectric being formed of a low k material;
    wherein an outermost interconnect metal layer includes a plurality of first conductive segments exposed from a surface of the inter-level dielectric for external connections; and
  a package substrate, comprising:
    a substrate body; and
    a plurality of second conductive segments disposed adjacent to a surface of the substrate body and exposed from the surface of the substrate body, wherein the second conductive segments are electrically connected to corresponding ones of the first conductive segments;
  wherein one of the first conductive segments comprises a first metal, a corresponding one of the second conductive segments comprises the first metal, and the semiconductor package structure further comprises:
    a middle region, located between the one of the first conductive segments and the corresponding one of the second conductive segments, and comprising the first metal;
    a first interface, located between the one of the first conductive segments and the middle region, and comprising the first metal and an oxide of a second metal, wherein a proportion of content of the first metal in the first interface is less than that of the first metal in the middle region; and
    a second interface, located between the corresponding one of the second conductive segments and the middle region, and comprising the first metal and the oxide of the second metal, wherein a proportion of content of the first metal in the second interface is less than that of the first metal in the middle region.

18. The semiconductor package structure according to claim 17, wherein the at least one inter-level dielectric is a plurality of inter-level dielectrics comprising an outermost inter-level dielectric, and the first conductive segments protrude from a surface of the outermost inter-level dielectric.

19. The semiconductor package structure according to claim 17, wherein a pitch between two first conductive segments is less than 20 μm.

20. The semiconductor package structure according to claim 17, wherein the second conductive segments protrude from the surface of the substrate body.

* * * * *